US012666927B2

(12) United States Patent
Vellanki et al.

(10) Patent No.: US 12,666,927 B2
(45) Date of Patent: Jun. 23, 2026

(54) SEMICONDUCTOR PROCESSING CHUCKS FEATURING RECESSED REGIONS NEAR OUTER PERIMETER OF WAFER FOR MITIGATION OF EDGE/CENTER NONUNIFORMITY

(71) Applicant: Lam Research Corporation, Fremont, CA (US)

(72) Inventors: Ravi Vellanki, San Jose, CA (US); Eric H. Lenz, Livermore, CA (US); Yu Pan, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 470 days.

(21) Appl. No.: 17/757,553

(22) PCT Filed: Dec. 17, 2020

(86) PCT No.: PCT/US2020/065746
§ 371 (c)(1),
(2) Date: Jun. 16, 2022

(87) PCT Pub. No.: WO2021/127272
PCT Pub. Date: Jun. 24, 2021

(65) Prior Publication Data
US 2023/0010049 A1     Jan. 12, 2023

Related U.S. Application Data

(60) Provisional application No. 62/951,849, filed on Dec. 20, 2019.

(51) Int. Cl.
H10P 72/78 (2026.01)
B23C 3/28 (2006.01)
(Continued)

(52) U.S. Cl.
CPC ................ H10P 72/78 (2026.01); B23C 3/28 (2013.01); C23C 16/06 (2013.01);
(Continued)

(58) Field of Classification Search
None
See application file for complete search history.

(56) References Cited

U.S. PATENT DOCUMENTS 5,925,411 A * 7/1999 van de Ven ......... C23C 16/4586
438/758
6,040,011 A 3/2000 Yudovsky et al.
(Continued)

FOREIGN PATENT DOCUMENTS

CN        1309524 C      4/2007
CN        1653587 B      5/2010
(Continued)

OTHER PUBLICATIONS

International Preliminary Report on Patentability dated Jun. 30, 2022, in PCT Application No. PCT/US2020/065746.
(Continued)

*Primary Examiner* — Jeffrie R Lund
*Assistant Examiner* — Tiffany Z Nuckols
(74) *Attorney, Agent, or Firm* — Weaver Austin Villeneuve & Sampson LLP

(57) ABSTRACT

Chucks for supporting semiconductor wafers during certain processing operations are disclosed. The chucks may include a recessed region near the outer perimeter of the wafer that has one or more surfaces that face towards the wafer but are recessed therefrom so as to not contact the wafer around the perimeter of the wafer. The use of such a recessed region prevents direct thermally conductive contact between the chuck and the wafer, thereby allowing the wafer to achieve a more uniform temperature distribution in cer-
(Continued)

tain process conditions. This has the further effect of causing certain processing operations to be more uniform with respect to edge-center deposition (or etch) layer thickness.

27 Claims, 13 Drawing Sheets

(51) Int. Cl.

| | | |
|---|---|---|
| *C23C 16/06* | (2006.01) |
| *C23C 16/455* | (2006.01) |
| *C23C 16/458* | (2006.01) |
| *H10P 72/76* | (2026.01) |

(52) U.S. Cl.

CPC .... *C23C 16/45565* (2013.01); *C23C 16/4583* (2013.01); *H10P 72/7616* (2026.01)

(56) References Cited

U.S. PATENT DOCUMENTS

| | | | |
|---|---|---|---|
| 6,890,403 B2 | 5/2005 | Cheung et al. |
| 7,941,039 B1 | 5/2011 | Shrinivasan et al. |
| 9,460,915 B2 | 10/2016 | Varadarajan et al. |
| 2007/0151517 A1 | 7/2007 | Baik et al. |
| 2009/0235866 A1* | 9/2009 | Kataigi ............... C23C 16/4586 |
| | | | 118/725 |
| 2017/0309512 A1* | 10/2017 | Yudovsky ........... H01L 21/6838 |
| 2020/0126773 A1* | 4/2020 | Unno ................... H01L 21/683 |

FOREIGN PATENT DOCUMENTS

| | | | |
|---|---|---|---|
| JP | H08191051 A | 7/1996 |
| JP | 2002518601 A | 6/2002 |
| JP | 2007067394 A | 3/2007 |
| JP | 2007182622 A | 7/2007 |
| JP | 2009256789 A | 11/2009 |
| JP | 2016063223 A | 4/2016 |
| JP | 2016184645 A | 10/2016 |
| KR | 100804169 B1 | 2/2008 |
| KR | 20180002414 U | 8/2018 |
| KR | 20190095495 A | 8/2019 |
| WO | WO-03067634 A1 | 8/2003 |

OTHER PUBLICATIONS

International Search Report and Written Opinion dated Apr. 19, 2021 in PCT Application No. PCT/US2020/065746.

JP Office Action dated Oct. 29, 2024 in JP Application No. 2022-535808 with English translation.

JP Office Action dated May 7, 2025 in JP Application No. 2022-535808, with English Translation.

KR Decision for Grant and Search Report dated Aug. 13, 2025 in KR Application No. 10-2022-7025114, with English translation.

KR Office Action dated Nov. 29, 2024 in KR Application No. 10-2022-7025114, with English Translation.

SG Written Opinion dated Jun. 25, 2025 in SG Application No. 11202250505H.

* cited by examiner

1202

Supply a piece of material

1204

Machine top surface of chuck

1206

Machine one or more vacuum grooves

1208

Machine one or more gas grooves

1210

Machine recessed region

SEMICONDUCTOR PROCESSING CHUCKS FEATURING RECESSED REGIONS NEAR OUTER PERIMETER OF WAFER FOR MITIGATION OF EDGE/CENTER NONUNIFORMITY

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

In some semiconductor wafer processing techniques, semiconductor wafers may be supported within a semiconductor processing chamber on a chuck. In some such chambers, the chuck may be a vacuum chuck that includes one or more features that allow a vacuum to be drawn on the back side of a semiconductor wafer, thereby generating a lower-pressure region between the semiconductor wafer and the chuck and causing the pressure within the semiconductor processing chamber to press the semiconductor wafer onto the chuck, thereby clamping the semiconductor wafer into place.

An alternative chuck style is an electrostatic chuck, which clamps the semiconductor wafer to the chuck using an electrostatic charge generated by an electrode embedded in the chuck.

Presented herein are various improvements to semiconductor wafer chucks that generate increased wafer edge-center uniformity.

SUMMARY

The present disclosure is directed at improvements for wafer chucks for semiconductor processing. It is generally conventional practice to provide support generally across the entire span of the underside (or backside) of a semiconductor wafer using a chuck during semiconductor processing. This helps mitigate potential exposure of the underside of the semiconductor wafer to process gases and provides additional clamping surface.

In certain semiconductor processing operations, such as a low-fluorine tungsten deposition process, it was found that deposition operations generated a noticeably edge-biased deposition layer, i.e., a deposition layer that increased in thickness near the edge of the semiconductor wafer. For example, in some instances, such as low-fluorine tungsten depositions processes, the deposition layer thickness near the edge of the semiconductor wafer was found to be over eight standard deviations higher than in the central region of the semiconductor wafer.

It was observed that the increased deposition thickness near the edges appeared to be correlated with edge-to-center temperature nonuniformity in the semiconductor wafer. It was determined by the inventors that modifying the chuck so as to have a generally annular, recessed region that left the outer perimeter of the semiconductor wafer generally physically unsupported by direct contact with the chuck in that region would have a beneficial effect in that it would prevent direct conductive heat transfer into the outer perimeter of the semiconductor wafer from the chuck. By modifying the chuck to have such a recessed area, wafer-edge non-uniformity was reduced significantly, e.g., from eight standard deviations to approximately five and a half standard deviations with respect to the central region of the semiconductor wafer. Thus, adding the recessed region to the chuck resulted, in one instance, in a significant improvement of approximately 33% in terms of standard deviations.

In many such implementations, an inert gas (which may also be referred to herein as a "buffer gas") may be flowed past the edge of the semiconductor wafer from one or more channels or ports in the chuck in an annular area that coincides with the outer edge of the semiconductor wafer. The inert gas, in the context of this application, will be understood to be any gas or gas mixture that is considered to be non-reactive or otherwise deemed to have a negligible chemical interaction with whatever process gases are used to perform semiconductor processing operations within the chamber having the chuck. Inert gases may thus include noble gases, e.g., argon, or, for example, nitrogen. Such inert gas flow may act to shield the edge surface(s) of the semiconductor wafer from exposure to the processing gases and thus prevent or reduce the exposure of the edge surface(s) to the processing gas, thereby preventing or reducing the amount of unintended deposition and/or etching that occurs on the edge surface(s) during processing operations. Similarly, such inert gas may also shield or help shield the back side of the semiconductor wafer. For example, if a vacuum chuck is used to clamp the semiconductor wafer in place, gas around the perimeter of the semiconductor wafer may be drawn underneath the semiconductor wafer by the vacuum that is drawn on the back side of the semiconductor wafer in order to clamp it into place. By flowing an inert gas past the perimeter/edge of the semiconductor wafer, the gas closest to the semiconductor wafer perimeter that may be sucked underneath the semiconductor wafer is inert instead of process gases that may be reactive with the semiconductor wafer.

In chucks featuring a vacuum clamping feature for securing the semiconductor wafer to the chuck, the recessed region may be dimensioned such that a minimum annular area of wafer-to-chuck contact exists between the recessed region and the outermost vacuum clamping feature(s). For example, if the vacuum clamping feature(s) for a given vacuum chuck include an outermost feature that is a circumferential channel in the surface of the chuck that is fluidically connected with a vacuum source so as to draw a vacuum on the circumferential channel, then the recessed region may be sized such that the gap between the innermost edge of the recessed region and the outermost edge of the semiconductor wafer is 50% or less of the gap between the outermost edge of the semiconductor wafer and the outermost edge of the circumferential channel. Such a configuration may preserve sufficient contiguous wafer/chuck contact between the semiconductor wafer and the chuck around the circumferential groove so as to preserve vacuum clamping functionality while still providing a sufficiently large recessed region to reduce or mitigate semiconductor wafer edge-heating.

In some implementations, an apparatus for semiconductor processing may be provided. The apparatus may include, or be, a pedestal having a heating element and a top plate. The top plate may include a substrate support surface configured to support a semiconductor wafer when the semiconductor wafer is placed on the pedestal, one or more vacuum grooves located entirely within a center region of the pedestal, each vacuum groove extending up to the substrate support surface and having an outer edge, wherein a center axis of the top plate passes through the center region. The top plate may also include a gas groove that is substantially annular, extends around the center region of the pedestal, and has an inner edge and an outer edge and a recessed region having one or more recessed surfaces and an inner perimeter positioned between the center region and the inner edge of the gas groove. The one or more recessed surfaces may each be offset along the center axis from a reference plane coincident with the substrate support surface so that there is a gap between the one or more recessed surfaces and the reference plane, and, for each vacuum groove of the one or more vacuum grooves, the portion of the outer edge of the vacuum groove that is closest to the inner perimeter may be separated from the inner perimeter by a corresponding first distance $D_1$ and separated from the closest portion of the gas groove by a corresponding second distance $D_2$.

In some implementations $(D_2-D_1)/D_2$ may equal $0.4\pm0.1$. In some other implementations, $(D_2-D_1)/D_2$ may equal $0.25\pm0.05$. In some further implementations, $(D_2-D_1)/D_2$ may equal $0.15\pm0.05$.

In some implementations, the inner edge of the gas groove may at least partially bound the recessed region.

In some implementations, there may be a radial gap between the inner edge of the gas groove and an outer perimeter of the recessed region.

In some implementations, the gap between the one or more surfaces of the recessed region and the substrate support surface may be less than or equal to 0.05 inches.

In some implementations, the inner edge of the gas groove may be within a circular region having a diameter of 300 mm±1 mm and the outer edge of the gas groove is outside of the circular region.

In some implementations, the top plate is made of aluminum or may be made of a ceramic.

In some implementations of the apparatus, the apparatus may further include a process chamber, an inert gas source, and a vacuum source. In such implementations, the pedestal may be located within the process chamber, the inert gas source may be configured to controllably flow an inert gas to the gas groove, and the vacuum source may be configured to controllably draw a vacuum on the one or more vacuum grooves.

In some such implementations, the apparatus may further include a showerhead positioned above the pedestal and configured to distribute gases flowed therethrough towards the pedestal. Such an apparatus may also include one or more process gas sources that are each configured to controllably flow a corresponding process gas through the showerhead.

In some such implementations, the one or more process gas sources may be configured to controllably flow a metal-containing gas that also includes an element selected from the group consisting of fluorine and chlorine.

In some implementations, a chuck for supporting a semiconductor wafer during semiconductor processing may be provided. The chuck may include a substrate support surface configured to support the semiconductor wafer when the semiconductor wafer is placed thereupon, one or more vacuum grooves located within a center region of the chuck, each vacuum groove extending up to the substrate support surface and having an outer edge, a gas groove that extends around the center region and has an inner edge and an outer edge, and a recessed region having one or more recessed surfaces and an inner perimeter interposed between the center region and the inner edge of the gas groove. A center axis of the chuck may pass through the center region and may be perpendicular to the substrate support surface. In such implementations, the one or more recessed surfaces may each be offset along the center axis from a reference plane coincident with the substrate support surface so that there is a gap between the one or more recessed surfaces and the reference plane, and the smallest circular region that encircles the one or more vacuum grooves may be separated from the inner perimeter by a first distance $D_1$ and separated from the closest portion of the gas groove by a second distance $D_2$ and $(D_2-D_1)/D_2=0.3\pm0.2$.

In some implementations, a method may be provided that includes fabricating a top plate. The top plate may include a substrate support surface configured to support a semiconductor wafer when the semiconductor wafer is placed thereupon, one or more vacuum grooves located within a center region of the top plate, each vacuum groove extending up to the substrate support surface and having an outer edge, a gas groove that extends around the center region of the pedestal and has an inner edge and an outer edge, and a recessed region having one or more recessed surfaces and an inner perimeter located between the center region and the inner edge of the gas groove. A center axis of the top plates may pass through the center region. In such implementations, the one or more recessed surfaces may each be offset along the center axis from a reference plane coincident with the substrate support surface so that there is a gap between the one or more recessed surfaces and the reference plane, and, for each vacuum groove of the one or more vacuum grooves, the portion of the outer edge of the vacuum groove that is closest to the inner perimeter may be separated from the inner perimeter by at least a corresponding first distance $D_1$ and separated from the closest portion of the gas groove by at least a corresponding second distance $D_2$.

In some such implementations, for each vacuum groove, $(D_2-D_1)/D_2=0.3\pm0.2$.

In some implementations, the gap between the one or more surfaces of the recessed region and the reference plane may be less than or equal to 0.05 inches.

In some implementations, the inner edge of the gas groove may be within a circular region having a diameter of 300 mm±1 mm and the outer edge of the gas groove may be outside of the circular region.

In some implementations, a material of the top plate may be aluminum or ceramic.

In some implementations, the method may further include supplying a piece of material for the top plate, machining the substrate support surface into the top plate, forming the vacuum groove in the piece of material, forming the gas groove in the piece of material, and forming the recessed region in the piece of the material.

In some implementations, the fabricating the top plate may further include machining the recessed region in the piece of material by milling away an annular zone of the material.

In some implementations, the fabricating the top plate may further include turning the piece of material using a lathe to form the recessed region by cutting away an annular zone of the material using a lathe tool.

BRIEF DESCRIPTION OF DRAWINGS

FIGS. 3-1 through 3-3 depict different vacuum groove configurations.

FIGS. 5-1 through 5-3 depict side section, isometric detail cutaway, and detail cutaway views, respectively, of an example chuck with a recessed region; FIG. 5-4 depicts a detail cutaway view of an alternate implementation of the example chuck.

FIGS. 6-1 through 6-3 depict side section, isometric detail cutaway, and detail cutaway views, respectively, of another example chuck with a recessed region.

FIGS. 7-1 through 7-3 depict side section, isometric detail cutaway, and detail cutaway views, respectively, of yet another example chuck with a recessed region.

DETAILED DESCRIPTION

Figure 1:
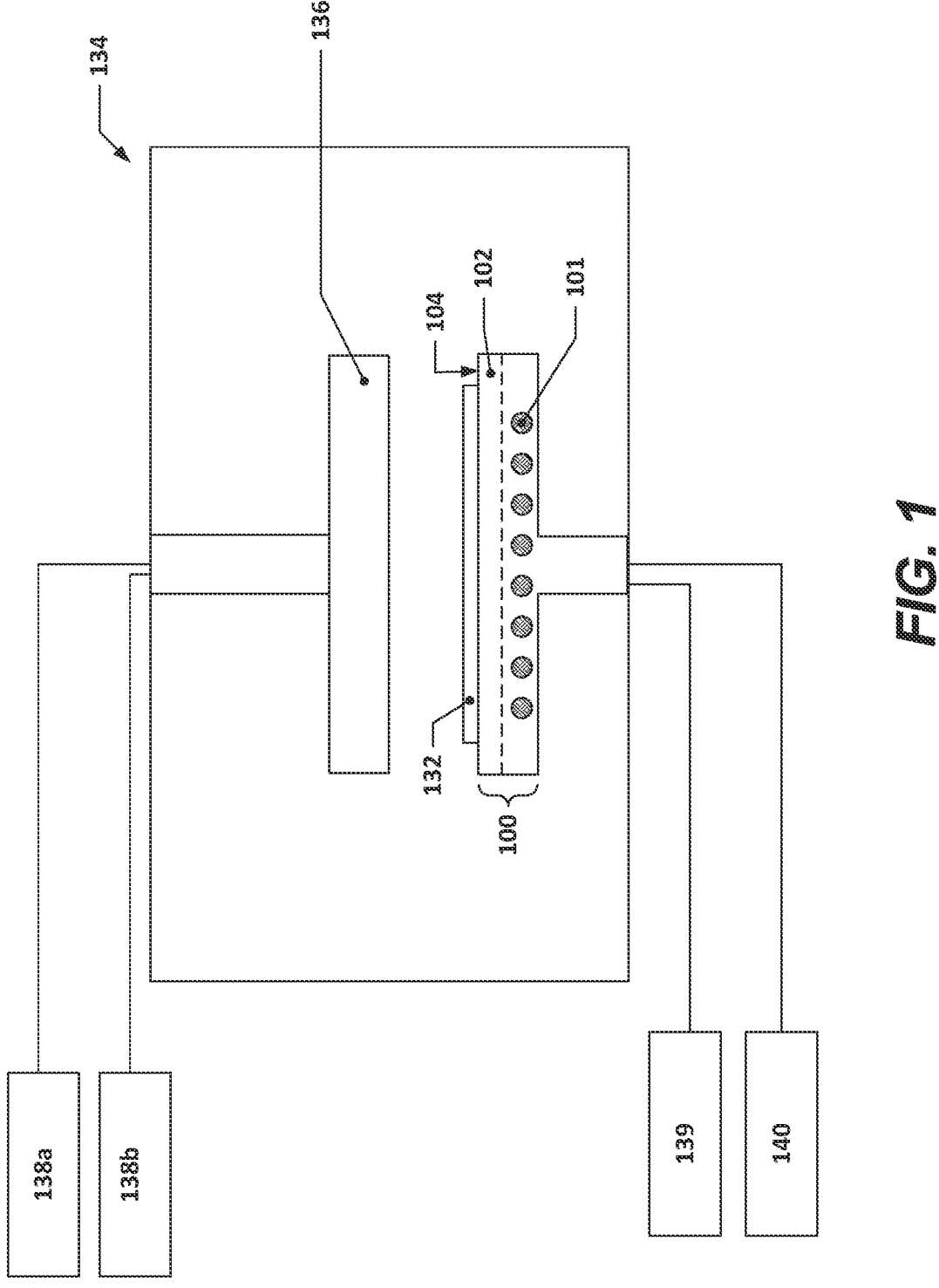
FIG. 1 depicts a schematic of a semiconductor processing chamber.

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

During deposition processes, it is often desirable to deposit a film with a uniform thickness (or at least a film with a thickness less than a threshold amount of non-uniformity) across an entire substrate, e.g., a semiconductor wafer. As mentioned earlier, film thickness uniformity can depend on, among other things, the temperature gradient of a substrate during a semiconductor processing operation. During certain deposition operations, if the substrate has a non-uniform temperature, the deposition process may deposit the film with a correspondingly non-uniform thickness on the substrate. Often the temperature gradient across a substrate features a higher temperature near the substrate's edge and a lower temperature (compared to the temperature near the substrate's edge) near the substrate's center. This, in turn, may cause the thickness of a deposition layer to be increased near the edge of the substrate as compared with the center of the substrate. In such cases, improving the thickness uniformity of the film across the substrate during deposition may be achieved by creating a more uniform temperature gradient across the substrate by reducing the temperature near the substrate's edge while leaving the temperature near the center of the substrate largely alone, increasing the temperature of the substrate near the substrate's center while leaving the temperature near the edge of the substrate largely alone, or both reducing the temperature of the substrate near the edge of the substrate while causing the temperature near the center of the substrate to be increased. While the present discussion relates to deposition processes, some etch processes may exhibit similar behavior with regard to etch uniformity and temperature effects; the structures and techniques discussed herein may therefor also be applicable to address similar issues that may result during etch processes.

During the deposition process, the substrate is supported on a top plate of a chuck of a heated pedestal in a process chamber and may experience heat transfer via thermal conduction via the top plate, thermal convection via any gases that are trapped between the substrate and the top plate, and/or thermal radiation. Due to the process conditions experienced by most substrates during wafer processing operations, the amount of heat transfer from thermal radiation is typically significantly lower than the amounts of heat transfer that collectively arise from thermal conduction and thermal convection heat transfer mechanisms. To reduce the temperature near the substrate's edge, a recessed feature was designed into the top plate of the heated pedestal to remove a direct conductive heat transfer path to the edge of the substrate. The recessed feature sits below the surface of the top plate which supports the substrate and may be located near the substrate's edge when the substrate is correctly positioned, e.g., in the position that the substrate would be in during processing operations, on the top plate. When the substrate is supported on the top plate having the recessed feature, the back side of the substrate near the substrate's edge is not in contact with the heated pedestal (or at least nearly all of the outermost annular region of the substrate back side is not in contact with the heated pedestal), thereby removing a direct thermal conduction path to the substrate's edge. By removing direct thermal conduction to the substrate's edge, the temperature near the substrate's edge may be reduced, thereby improving the uniformity of the temperature gradient. The improved temperature uniformity may correspondingly improve the thickness uniformity resulting from the deposition process.

FIG. 1 depicts a schematic of a chamber 134 which may be used during a deposition (or etch) process. Within the chamber 134, there may be a pedestal 100. The pedestal 100 may have a heating element 101 and a chuck 102; in some implementations, the chuck may be integral to the pedestal, whereas in other implementations, the chuck may be a separate component that is mounted, either fixedly (through bonding of some sort) or removably (using, for example, threaded fasteners), to the remainder of the pedestal structure. The "top plate" of the chuck 102 may be either a discrete part, e.g., that is bonded to one or more other plates to form the chuck or may simply be the chuck 102 itself, i.e., the chuck may be a single-plate design. In other implementations, the chuck may, as discussed above, be an integral part of the pedestal; in some such implementations, the top plate may also be an integral part of the pedestal, i.e., the pedestal, chuck, and top plate may all be provided by nominally the same structure. The chuck 102 (or top plate) may have a top surface 104 configured to support a semiconductor wafer 132 during deposition operations. The pedestal 100 may be fluidically connected to a gas source 139 which may be configured to supply an inert gas to the pedestal 100. The inert gas, as discussed earlier, may be any gas or gas mixture that may be considered non-reactive or otherwise deemed to have a negligible chemical interaction with whatever process gases which may be used to perform semiconductor processing operations within the chamber 134. The inert gas may include noble gases, e.g., argon, or relatively unreactive gases, e.g., nitrogen, or mixtures thereof. In some implementations, the pedestal 100 may also be fluidically connected to a vacuum source 140, e.g., a vacuum pump or a facility vacuum supply line, which may be used to draw a vacuum and secure the semiconductor wafer 132 to the top surface 104 of the chuck 102. Within the chamber 134, there may be a showerhead 136 or other gas distribution system which may be fluidically connected to one or more gas sources 138. In the embodiment depicted in FIG. 1, there are two gas sources, 138a and 138b. The gas sources fluidically connected to the showerhead 136 may be configured to controllably supply process gases during semiconductor processing operations.

Figure 2:
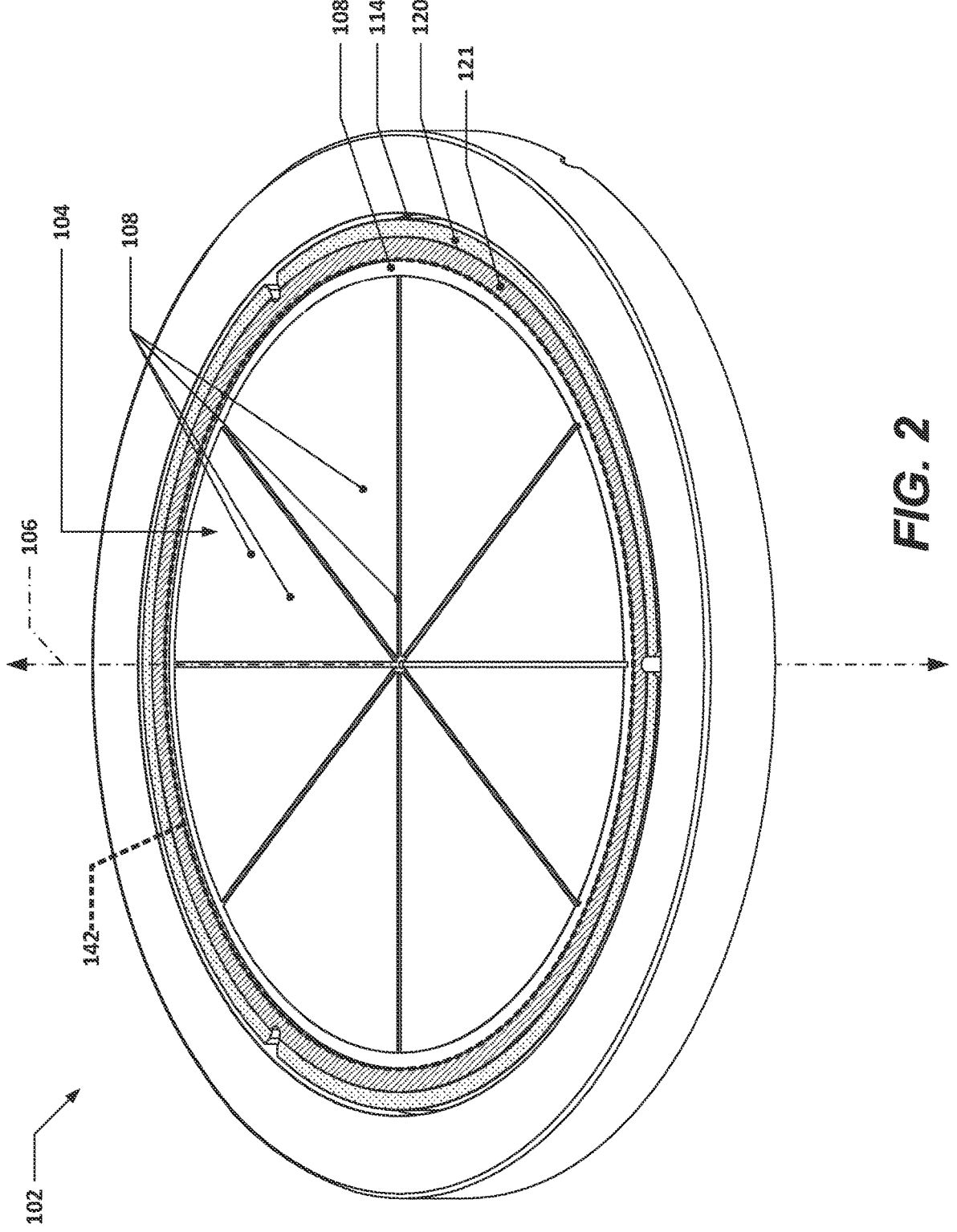
FIG. 2 depicts an isometric view of a chuck for supporting a semiconductor wafer.

FIG. 2 depicts the chuck 102 of the pedestal 100. The chuck 102 has a top surface 104 that is configured to support the semiconductor wafer 132. The top surface 104 may have one or more vacuum grooves 108 located therein; in FIG. 2, there are multiple vacuum grooves 108 that are fluidically connected together, including several radial vacuum grooves 108 and an outer annular vacuum groove 108 that is centered on center axis 106, all of which are fluidically connected with one another and one or more vacuum ports, e.g., such as the centrally located vacuum port visible in the middle of the chuck 102, that may be fluidically connected with the vacuum source 140. The vacuum grooves 108 may be used to draw a vacuum on the semiconductor wafer 132, thereby causing it to be clamped into position while being supported by the top surface 104 of the pedestal chuck 102 during a deposition (or etch) process. By creating a vacuum on the back side of the semiconductor wafer, a negative pressure differential may be created between the top side of the semiconductor wafer and the back side of the semiconductor wafer, i.e., the pressure underneath the semiconductor wafer may be lower than the pressure above the semiconductor wafer (such pressure differentials may, in some cases, only be on the order of several Torr, e.g., <10 Torr).

Generally speaking, the outermost vacuum groove feature(s) 108 of the chuck 102 may have a seal region extending outward from the outermost vacuum groove feature(s) 108 that provides an uninterrupted zone of chuck 102/semiconductor wafer 132 contact, thereby ensuring that the vacuum behind the back side of the semiconductor wafer 132 can be reliably maintained without requiring excessive gas flow to the vacuum source 140. It will be understood that a variety of patterns for the vacuum groove(s) 108 may be used to provide vacuum clamping functionality. The vacuum groove 108 may be a single continuous groove or may feature multiple grooves separate from each other, the vacuum groove may encircle the center axis 106 of the chuck 102 or may not. One example of a vacuum groove pattern is depicted in FIG. 2, where the vacuum grooves 108 are provided by a series of concentric annular vacuum grooves 108 that are fluidically interconnected with each other by various near-radial vacuum grooves 108. It will be noted that the outermost edges of the one or more vacuum grooves 108 may generally define a center region 142, in this case a circle, that contains all of the vacuum grooves 108. The center region 142 may typically be centered on the center axis 106 of the top plate of the pedestal.

Also visible in FIG. 2 are a recessed region 120 and a vacuum seal region 121, which may be bounded on the inside by the center region 1042 and on the outside by the innermost edge of the recessed region 120; the vacuum seal region 121 may be part of the top surface 104, i.e., in contact with the underside of the semiconductor wafer 132 when the semiconductor wafer 132 is resting on the chuck 102.

Figures 1, 2, 3:
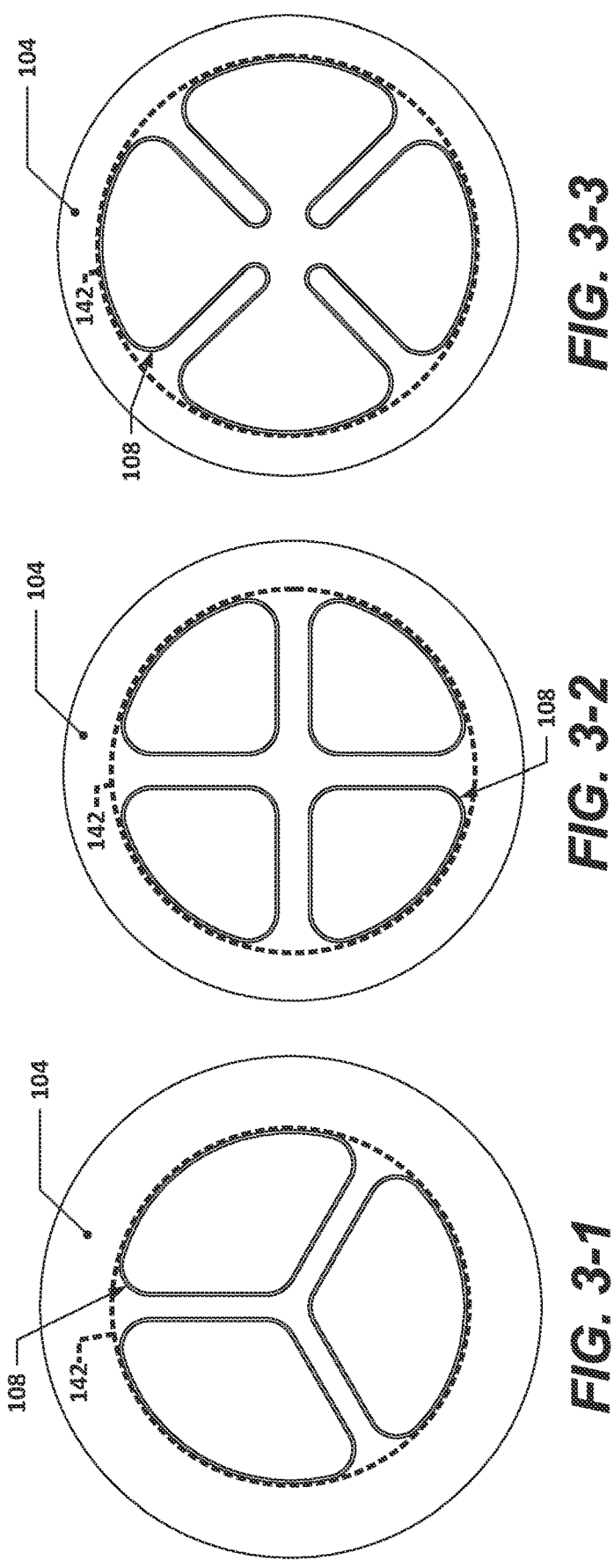

FIGS. 3-1 through 3-3 depict additional examples of potential patterns that may be used for the vacuum grooves 108 on the top surface 104. In FIG. 3-1, the vacuum groove(s) 108 include three separate grooves arranged around, but not encircling, the center of the top surface 104 of the chuck. The example in FIG. 3-2 depicts a vacuum groove 108 pattern that features four vacuum grooves 108. FIG. 3-3 is another example where there vacuum groove 108 pattern has one continuous pattern that encircles the center of the center of the top surface 104. Instead of having rings, the pattern has a groove that continuously snakes between the outer edge and the center of the top surface 104. It will be noted that in all three example sets of vacuum groove(s) 108 in FIGS. 3-1 through 3-3, a center region 142 is shown that contains all of the vacuum grooves 108 for each example top surface 104. The center region 142 for each top surface 104 may be generally thought of as a circular region (or near-circular region) that encloses all of the vacuum grooves 108 for the top surface 104 and that contacts the outermost edges of the outermost portions of that vacuum groove 108 or those vacuum grooves 108. The above examples are provided to further illustrate aspects of various embodiments. The examples are provided to exemplify and more clearly illustrate aspects and are not intended to be limiting.

Moving back to FIG. 2, the chuck 102 may have a gas groove 114. In such implementations, the gas groove 114 is a continuous (or nearly continuous) groove that may be placed towards the outer edge of the top surface 104 of the chuck 102. The gas groove 114 may be sized and located so that when the semiconductor wafer 132 is placed on the top surface 104 prior to the deposition process, the edge of the semiconductor wafer 132 may be positioned such that gas flowing from the gas groove 114 comes into contact with the edge of the semiconductor wafer 132, e.g., the gas groove 114 may sit directly below the edge of the semiconductor wafer. Additionally, it will be observed that the recessed region 120 may generally be bounded by the innermost edge of the gas groove 114. Generally speaking, the gas groove 114 may be substantially annular, e.g., so as to deliver inert gas around the entire perimeter of a semiconductor wafer. In most instances, the gas groove 114 may be a single, annular groove that is generally the same nominal diameter as the semiconductor wafer, e.g., 300 mm, and which may be on the order of one to several millimeters wide, e.g., 1 mm or 2 mm wide.

The gas groove 114 may be fluidically connected to a gas source, e.g., gas source 139, which may supply an inert gas. The gas groove 114 may flow the inert gases into the processing chamber such that the flow of the inert gas may act to shield the edge surface(s) of the semiconductor wafer from exposure to process gas(es) and may prevent or reduce the amount of unintended deposition and/or etching that may occur at the edge surfaces of the semiconductor wafer during semiconductor processing operations.

Figure 4:
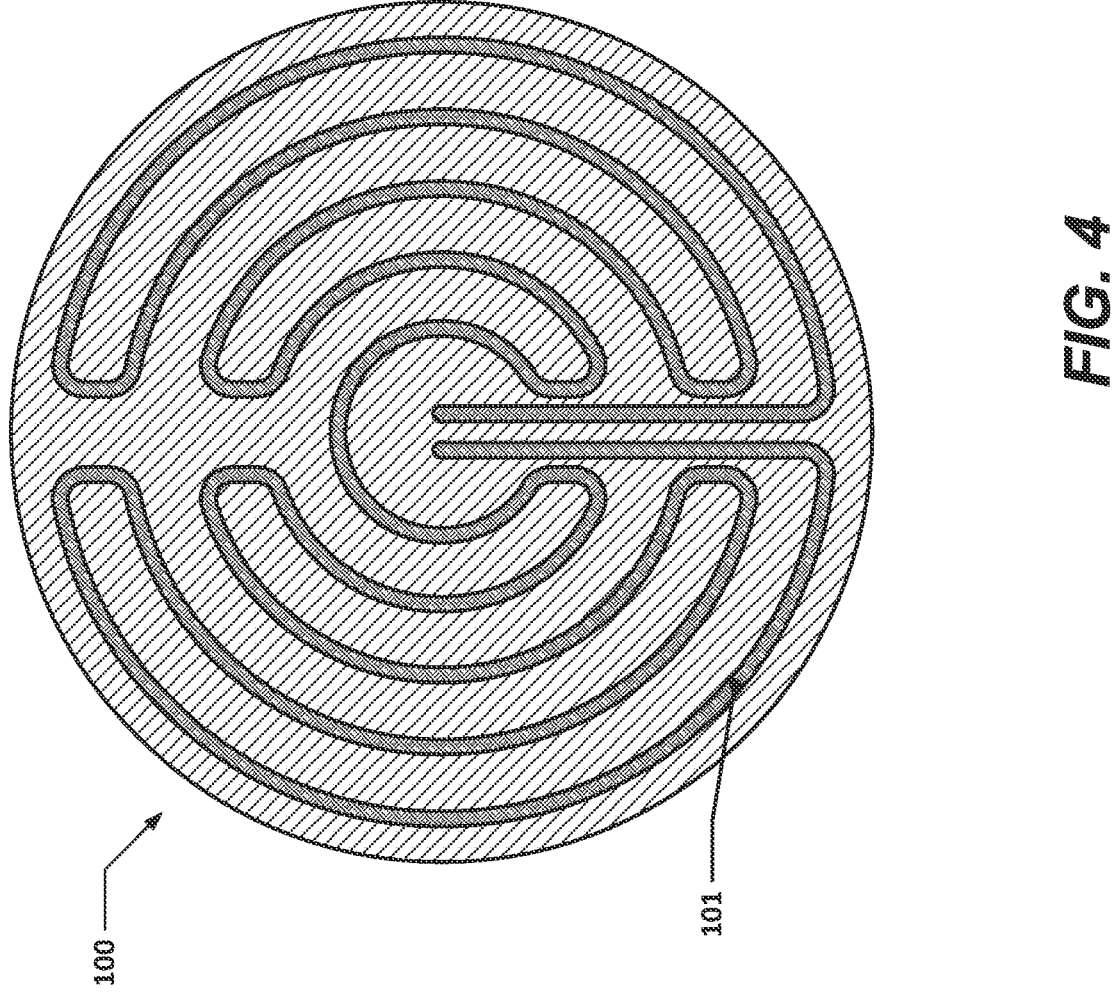
FIG. 4 depicts a section view showing a heater coil for a chuck.

As noted with respect to FIG. 1, the pedestal 100 may include a heating element 101. FIG. 4 is a section plan view of the pedestal 100 that depicts an example of a heating element 101 in the pedestal 100. FIG. 4 shows a cross-section view of the pedestal 100 that is below the chuck. The heating element 101, which may, for example, be a resistive heating element or a liquid flow path for circulating heated or cooled liquid, may be used to temperature of the pedestal 100 during semiconductor processing operations, in particular to control the temperature of the top surface 104 during a deposition or etching process. The top surface 104 of the pedestal 100, once heated by the heating element 101, may heat the semiconductor wafer during the deposition process. Such heating may occur largely through thermally conductive heat transfer arising between contacting portions of the chuck 102 and the semiconductor wafer 132, although there may also be additional non-negligible conductive and/or convective heat transfer that occurs between the chuck 102 and the semiconductor wafer 132 via any gas that may be trapped between the semiconductor wafer 132 and the chuck 102.

As noted earlier, the radial temperature profile of the semiconductor wafer 132 may exhibit a temperature difference during processing in which the temperature towards the edge of the semiconductor wafer is higher than the temperature towards the center of the semiconductor wafer (or within the center region 142 thereof). As also noted earlier, this temperature difference may cause the thickness of a deposition layer (or etch layer) to be increased near the edge of the semiconductor wafer as compared with the center of the semiconductor wafer. To reduce the temperature difference in the semiconductor wafer 132 (and thus reduce the non-uniformity of the wafer process), the recessed region 120 may be included, as shown in FIG. 2, for example.

The recessed region 120 of FIG. 2 is an area on the chuck 102 that has one or more recessed surfaces (in FIG. 2, there are three arc-shaped recessed surfaces, each spanning approximately 120° of arc and forming, in aggregate, a substantially annular recessed region 120) that are below the top surface 104 and may be located outside of the center region 142 and within the gas groove 114.

Figures 1, 2, 3, 5:
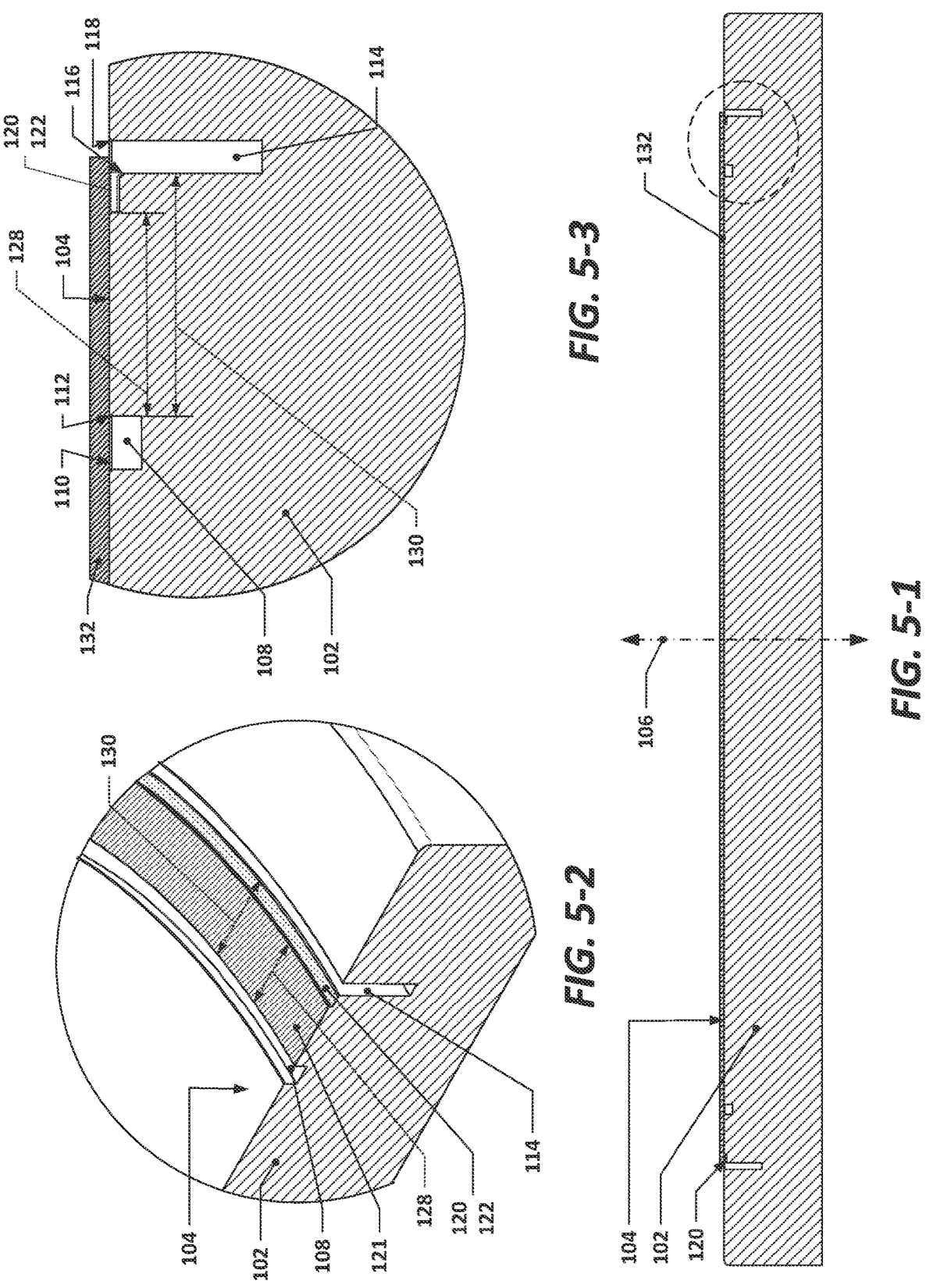
Figures 4, 5:
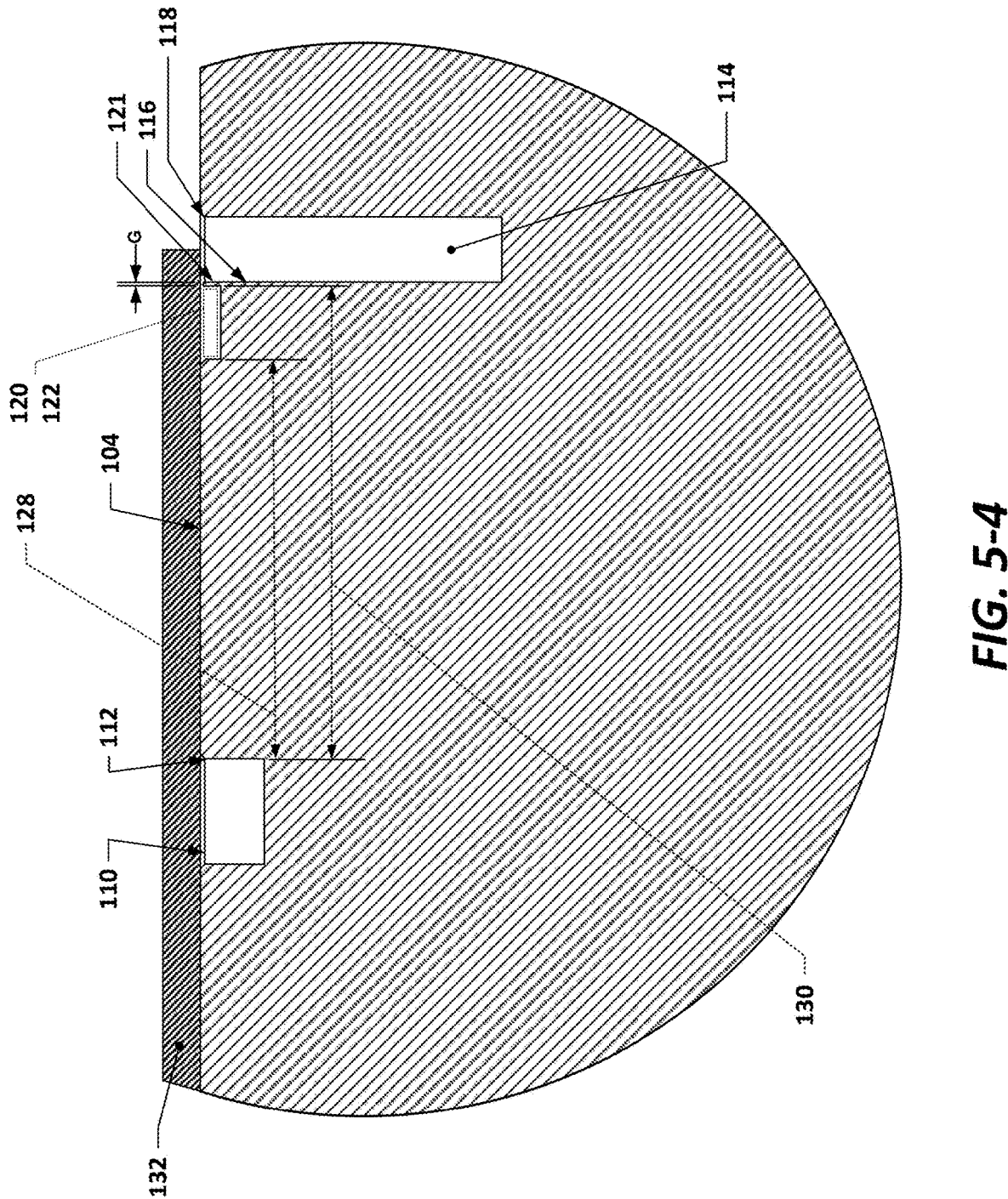

By way of further example, FIG. 5-1 shows a cross-section view of the chuck 102 that has an example of the recessed region 120 below the top surface 104 (for reference, the wafer 132 is shown resting on the top surface 104). FIGS. 5-2 and 5-3 show a more detailed view of the chuck 102 of FIG. 5-1.

FIG. 5-2 shows an isometric detail cutaway view of the circled portion of the chuck 102 of FIG. 5-1; the vacuum groove 108, the top surface 104, and the gas groove 114 of the chuck 102 are all clearly depicted, as is the vacuum seal region 121 and the recessed region 120. Also shown are a first distance 128 ($D_1$) and a second distance 130 ($D_2$); the first distance 128 is the minimum distance between the outermost edge of the center region 142 and the inner perimeter of the recessed region 120, and the second distance 130 is the minimum distance between the outermost edge of the center region 142 and the innermost edge(s) of the gas groove 114.

FIG. 5-3 depicts a detailed view of a region of the chuck 102 containing the vacuum groove 108, the gas groove 114, and the recessed region 120. In this embodiment, the semiconductor wafer 132 is positioned on the top surface 104 so as to have its outer edge overhang the gas groove 114. The recessed region 120 is located between the vacuum groove 108 and the gas groove 114. The vacuum groove 108 may have an inner edge 110 and an outer edge 112; correspondingly, the gas groove 114 may have an inner edge 116 and an outer edge 118.

The recessed region 120 may generally be a substantially annular area having an outer perimeter that is defined by the inner edge 116 of the gas groove 114 and an inner perimeter that lies between the outer edge(s) 112 of the outermost vacuum groove(s) 108 (or the center region 142) and the inner edge 116 of the gas groove 114. It will be understood that, for example, the recessed region 120 may not be a truly annular region, e.g., may have one or more polygonal edges on the inner and/or outer perimeters, may be segmented (such as into the three arcuate portions shown in FIG. 2), and/or may include one or more raised portions that may contact the underside of the semiconductor wafer 132 (for example, the recessed region 120 may include small bosses that are positioned along the outer perimeter thereof and which may have an aggregate upper surface area that contacts the semiconductor wafer but which is also much smaller, e.g., two or more orders of magnitude smaller, than the aggregate surface area of the recessed surface(s) of the recessed region). In the latter arrangement, there may still be conductive contact paths between the chuck 102 and the semiconductor wafer 132 through such bosses, but the limited conductive contact area may provide little effective heat transfer. Similarly, in some implementations, the inner edge of the gas groove may be separated from the recessed region by a radial gap G, e.g., by a thin circumferential wall 121 (see FIG. 5-4) that has a radial thickness that is quite small, e.g., an order of magnitude or more smaller than the radial thickness of the recessed region, so as to reduce the amount of heat transfer that may reach the semiconductor wafer via such a wall feature. Generally speaking, the recessed region may be designed so as to either eliminate or largely eliminate wafer/chuck contact outside of the inner perimeter of the recessed region. It is not the intent, however, that minor variants on this concept be excluded from coverage—in particular, chucks that feature a recessed region similar to those discussed herein but which include, for example, one or more small-contact-area features within the recessed region that are positioned to contact a semiconductor wafer supported by the chuck would still be considered within the scope of this disclosure.

As noted above, the recessed region 120 may be generally described as having a generally annular shape. The recessed region 120 may also be characterized as having a nominal radial thickness or width that is a percentage of the second distance 130. For example, this percentage may be expressed as $(D_2-D_2)/D_2$ and may be selected so as to be greater than or equal to 0.1 (10%) and less than or equal to 0.5 (50%), e.g., 0.4±0.1 (40%±10%), 0.25±0.05 (25%±5%), or 0.15±0.05 (15%±5%). For ease of reference, the recessed regions discussed herein may be referred to as being an X % undercut recessed region or a recessed region having an X % undercut or the like, which is to be understood to refer to a recessed region having a nominal radial thickness or width that is X % of the second distance. The term "undercut" is used since the recessed region "undercuts" the wafer when the wafer is placed on the chuck.

In FIG. 5-2, the recessed region 120 has a radial width that is 15% (0.15) of the distance between the outermost edge(s) of the vacuum groove(s) 108 and the inner edge of the gas groove 114 and is recessed away from the top surface 104 so as to form a gap in a direction parallel to the center axis 106 that is 0.015". It is noted that the recessed region 120 is not recessed from the top surface 104 by a great distance, and, in fact, it may be generally beneficial to select a depth for the recessed region 120 that is in the range of 0.005" to 0.050" (similar depths may be used in other implementations discussed herein). Such gap distances may act to curtail direct thermally conductive heat transfer between the semiconductor wafer 132 and the chuck 102 within the recessed region 120 while still largely preserving the heat transfer that occurs due to convective and/or conductive heat transfer mechanisms via the gas that may be trapped between the semiconductor wafer 132 and the chuck 102.

By having the recessed region 120 sit below the top surface 104, the recessed region 120 may be used to drastically reduce or eliminate thermal conduction between the chuck 102 and the semiconductor wafer 132 near the edge of the semiconductor wafer during process operations. The temperature reduction at the semiconductor wafer edge may allow the thermal profile of the semiconductor wafer 132 to become more uniform by changing the semiconductor wafer edge temperature to become closer to the semiconductor wafer center temperature.

Figures 1, 2, 3, 6:
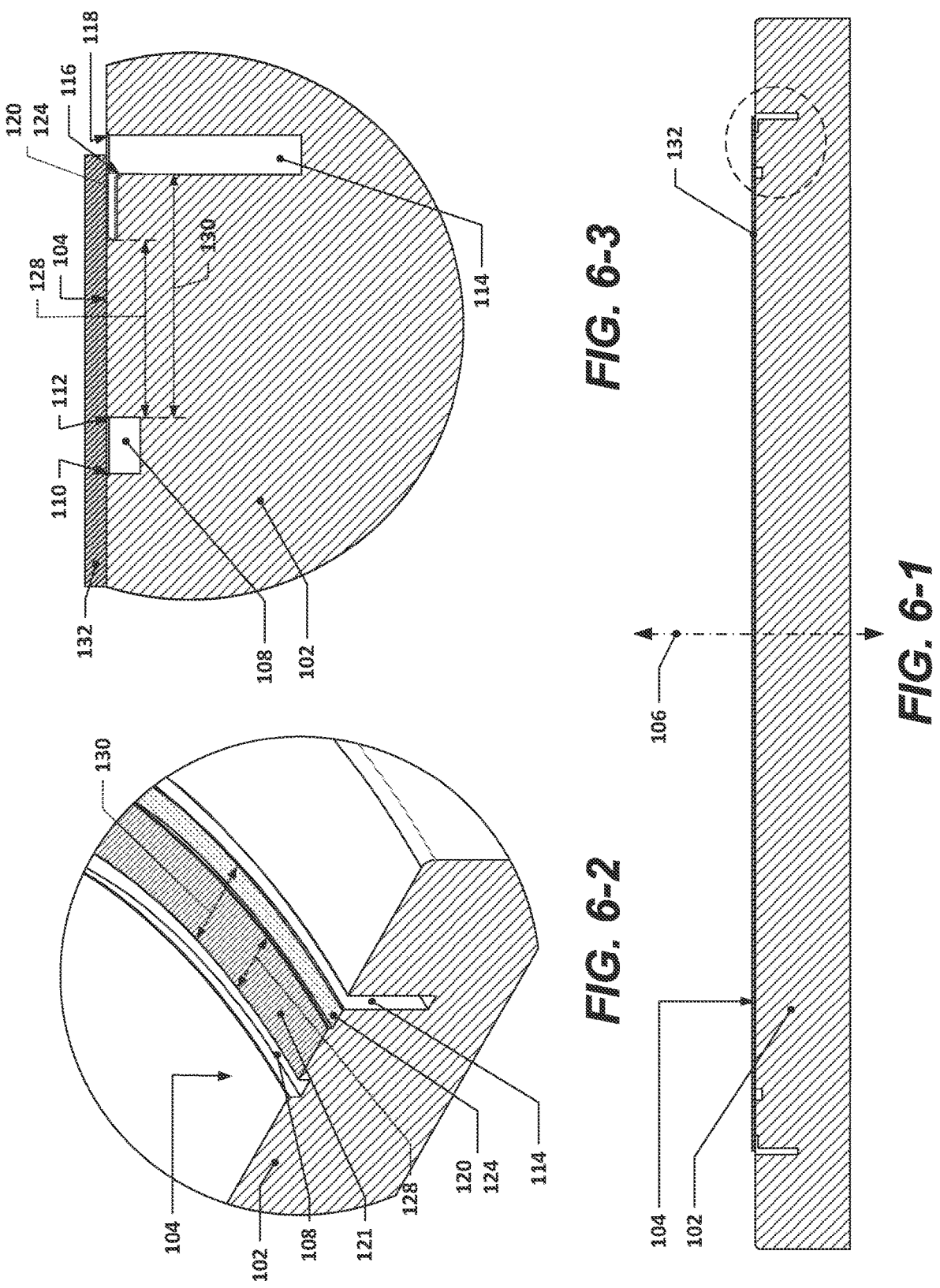
Figures 1, 2, 3, 7:
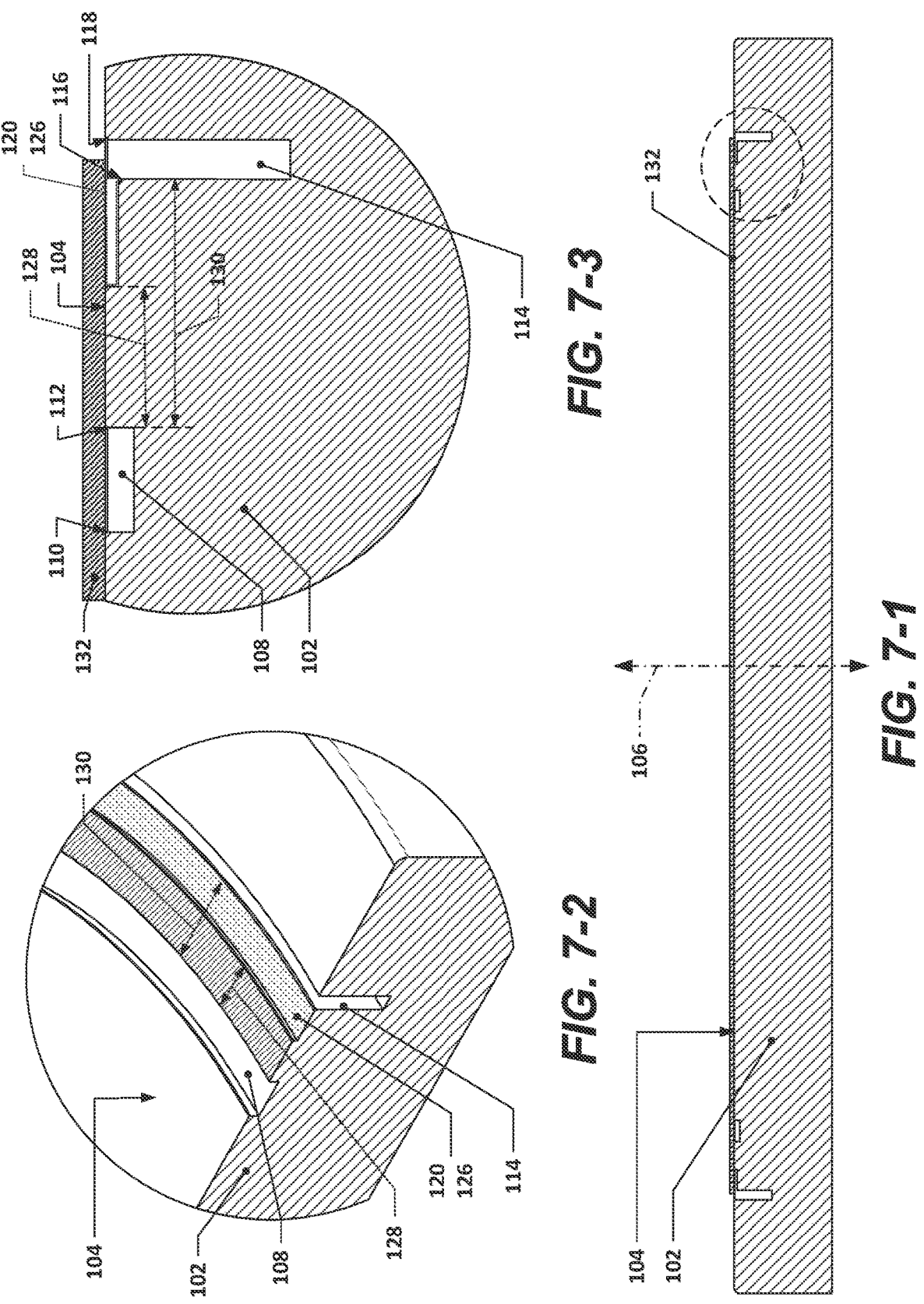

FIGS. 6-1 through 6-3 are similar to FIGS. 5-1 through 5-3, except that the recessed region 120 has a radial width that is 25% (0.25) of the distance between the outermost edge(s) of the vacuum groove(s) 108 and the inner edge of the gas groove 114. FIGS. 7-1 through 7-3 are correspondingly similar to FIGS. 5-1 through 5-3, except that the recessed region 120 has a radial width that is 40% (0.4) of the distance between the outermost edge(s) of the vacuum groove(s) 108 and the inner edge of the gas groove 114. As can be seen, the outermost vacuum groove 108 may, in some instances, be increased in size/radial width as the radial width of the recessed region 120 is increased so as to provide for more clamping force on the semiconductor wafer in the vacuum seal region 121 (thereby somewhat counteracting the increased opportunity for leakage that may be provided by the reduced area of the vacuum seal region 121).

Figure 8:
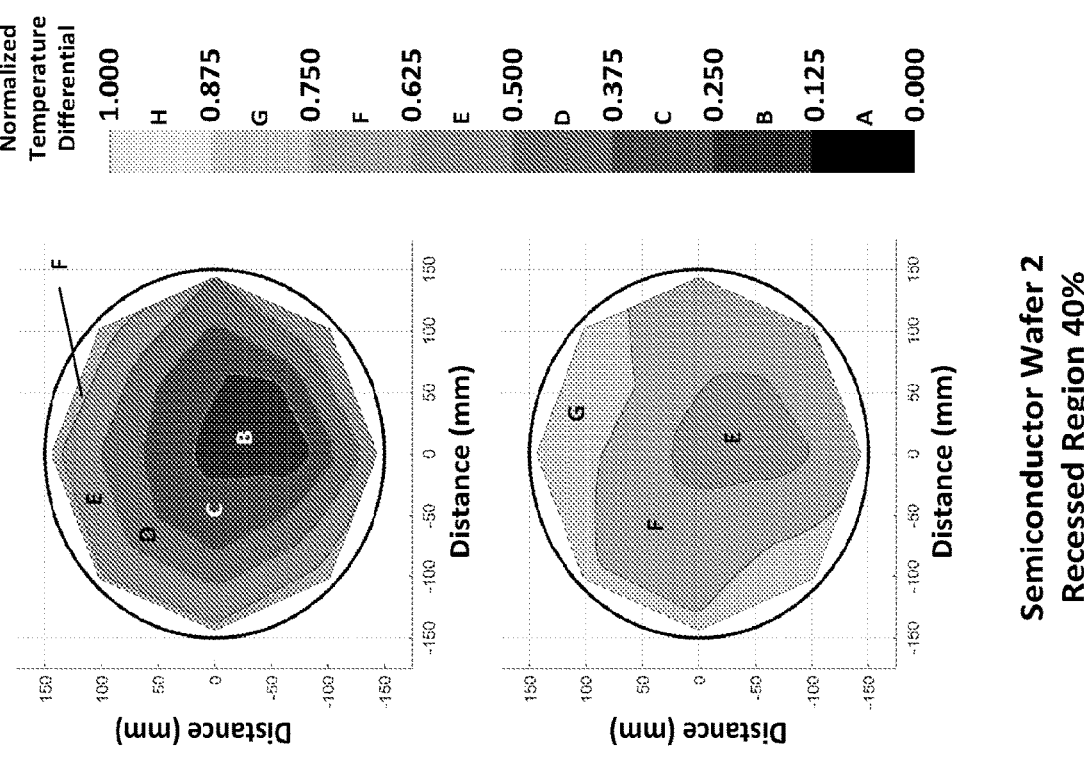
FIG. 8 depicts temperature maps of some example semiconductor wafers supported by different types of chucks under different process conditions.

To assist in illustrating the effect of including a recessed region (or "undercut") on a chuck, several tests were carried out using a chuck that included an undercut/recessed region and a chuck that did not. FIG. 8 shows results from such tests and depicts the temperature profiles of two groups of two semiconductor wafers where the semiconductor wafers in each group of semiconductor wafers were simultaneously processed at different stations of a multi-station process chamber that had different chucks. The semiconductor wafers in the first group were processed by performing a low-fluorine tungsten deposition process in which each chuck was heated to an elevated temperature, e.g., in the 300° C. to 500° C. range, the process region above each wafer was generally held to a pressure of approximately 10 Torr, and vacuum was pulled on the vacuum groove(s) of each chuck so that the backside pressure between the semiconductor wafer and the chuck was lower than that of the process region. The semiconductor wafers of the second group were tested under similar conditions except that the vacuum was pulled on the vacuum groove so that the pressure between the semiconductor wafer and the chuck was still below the pressure in the process region but was higher than the corresponding pressure in the first group by approximately 66%. In each group, there were two semiconductor wafers: semiconductor wafer 1 was tested with a pedestal with no recessed region and semiconductor wafer 2 was tested with a pedestal with a recessed region having a radial width of 40% (a "40% undercut" chuck or a "chuck with a 40% undercut recessed region") of the distance between the outermost edge(s) of the vacuum groove(s) and the inner edge of the gas groove, as shown in FIG. 5-3. The temperature distribution of each wafer was obtained during processing through measurements taken at the semiconductor wafer center, at eight equally spaced points along the outer edge of the semiconductor wafer, and at a further eight equally spaced points approximately midway between the wafer center and the outer edge of the semiconductor wafer. The heat maps indicating temperature have been normalized to an arbitrary dimensionless temperature difference scale to illustrate the decrease in temperature variance across the chuck with a 40% undercut as opposed to the chuck with no undercut.

The data for both sets of semiconductor wafers demonstrated that the maximum temperature difference between the centers of the semiconductor wafers and their respective edges was greatly diminished for the wafers subjected to processing on the 40% undercut chuck, as compared with the chuck having no recessed region or undercut at all. In particular, it was observed that for the first group of semiconductor wafers, the use of the 40% undercut chuck resulted in a decrease of 33% in the maximum edge/center temperature differential (and a decrease of 28% in the average edge/center temperature differential) as compared with the chuck having no recessed region, whereas the second group of semiconductor wafers experienced a 49% reduction in the maximum edge/center temperature differential (and a decrease of 44% in the average edge/center temperature differential) with the use of the 40% undercut chuck compared with the chuck having no recessed region. Thus, the use of the 40% undercut chuck dramatically reduced the edge/center temperature differential and the maintenance of a higher-pressure backside argon environment during processing further reduced the edge/center temperature differential.

Put another way, it can be seen that for Group 1, the wafer temperatures span seven temperature differential bands when the chuck with no recessed region is used, but the wafer temperatures only span five temperature differential bands when the 40% undercut chuck is used. Similarly, for Group 2, the wafer temperatures span five temperature differential bands when the chuck with no recessed region is used, but the wafer temperatures only span three temperature differential bands when the 40% undercut chuck is used. The reduction in temperature variation across the wafer (and chuck) that results from the use of the recessed regions is significant and highly beneficial with regard to obtaining higher wafer uniformity.

Figure 9:
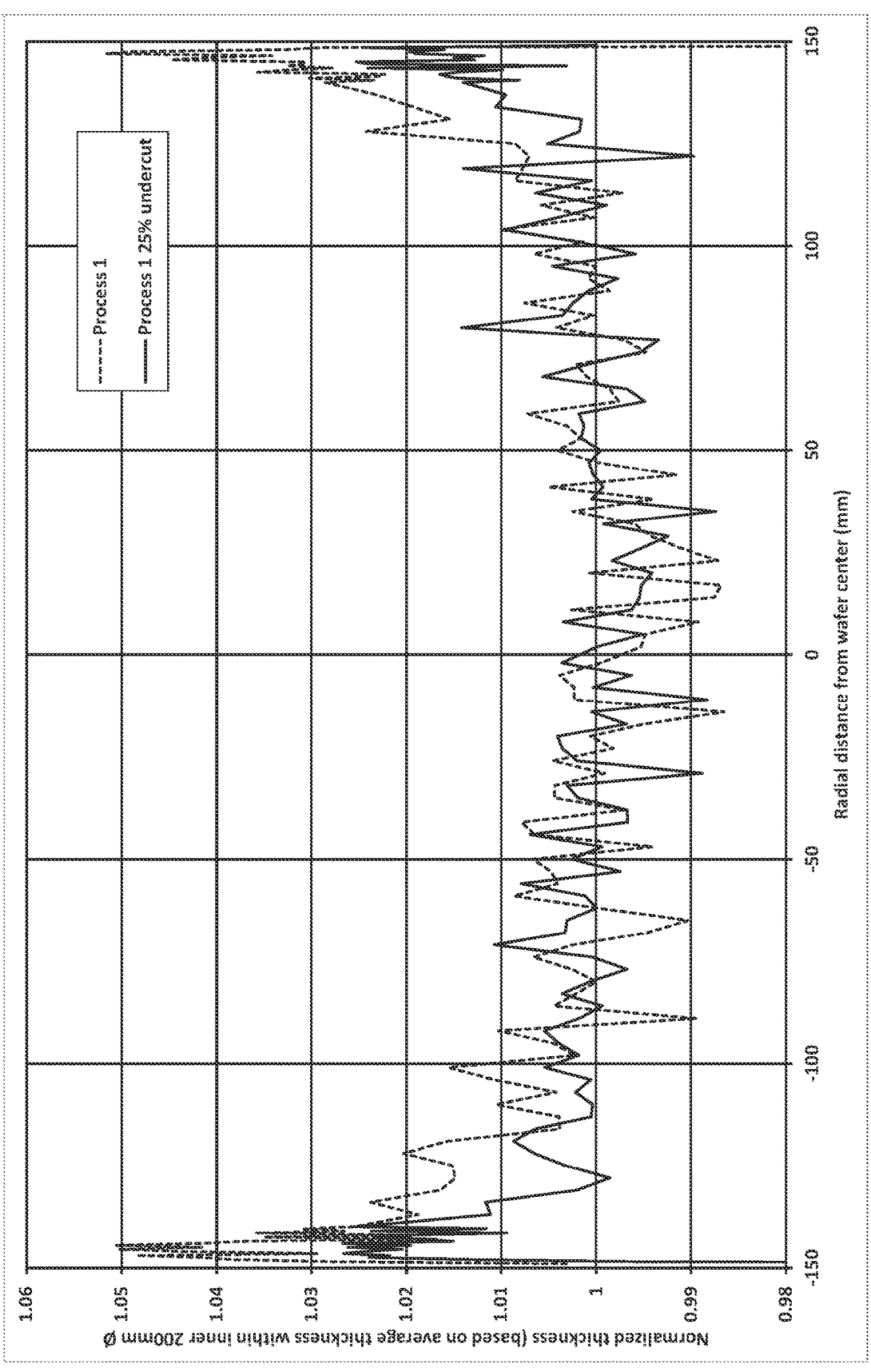
FIG. 9 depicts a plot of normalized deposition layer thickness for two semiconductor wafers subjected to similar semiconductor processes but supported by two different types of chuck.

FIG. 9 shows line scans of the normalized deposition layer thickness of two semiconductor wafers after being subjected to a similar deposition process; one semiconductor wafer was supported by a chuck without a recessed region, and the other semiconductor wafer was supported by a chuck with a 25% undercut recessed region. The dotted line represents the normalized deposition layer thickness of the semiconductor wafer supported by the chuck without the recessed region, and the solid line represents the normalized deposition layer thickness of the semiconductor wafer supported by the chuck with the 25% undercut recessed region. Both plotted deposition layer thicknesses were respectively normalized based on the average deposition layer thickness between −100 mm and +100 mm from the center of each respective wafer. As can be seen in FIG. 9, the maximum normalized deposition layer thickness at the edges of the semiconductor wafer supported by the chuck with the 25% undercut recessed region was approximately 2.5% above the baseline deposition layer thickness, whereas the maximum normalized deposition layer thickness at the edges of the semiconductor wafer supported by the chuck without a recessed region was approximately 5% above the baseline deposition layer thickness. Thus, the use of a chuck with a 25% undercut recessed region resulted in a 50% reduction in edge-region non-uniformity as compared to a chuck without a recessed region.

Figure 10:
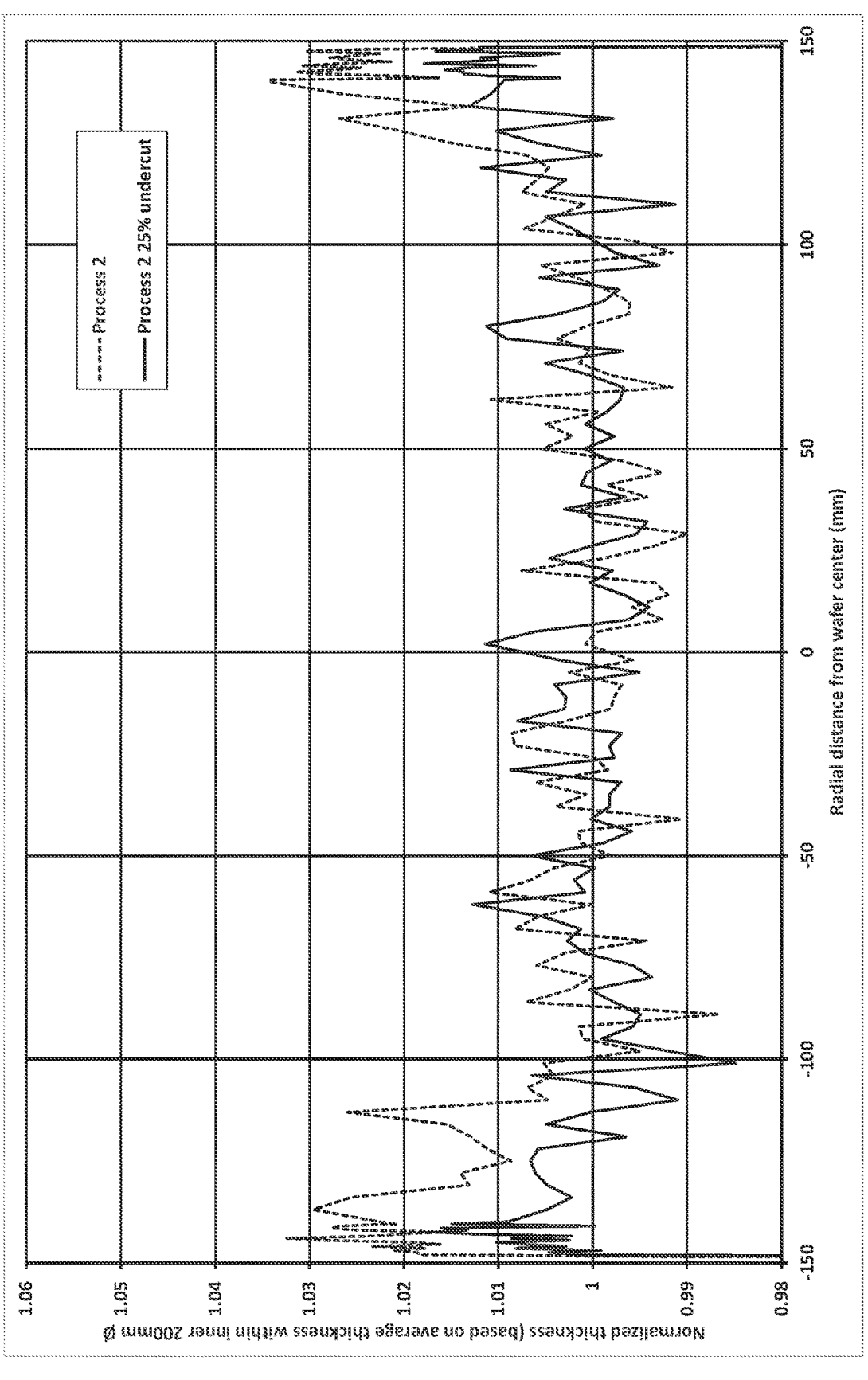
FIG. 10 depicts a plot of normalized deposition layer thickness for another two semiconductor wafers subjected to similar semiconductor processes, different from those of FIG. 9, but supported by two different types of chuck.

FIG. 10, similar to FIG. 9, shows line scans of the normalized deposition layer thickness of two semiconductor wafers after being subjected to a similar deposition process (different from the process used for FIG. 9, however); one semiconductor wafer was supported by a chuck without a recessed region, and the other semiconductor wafer was supported by a chuck with a 25% undercut recessed region. The dotted line represents the normalized deposition layer thickness of the semiconductor wafer supported by the chuck without the recessed region, and the solid line represents the normalized deposition layer thickness of the semiconductor wafer supported by the chuck with the 25% undercut recessed region. As with FIG. 9, both plotted deposition layer thicknesses were respectively normalized based on the average deposition layer thickness between −100 mm and +100 mm from the center of each respective wafer. As can be seen in FIG. 10, the maximum normalized deposition layer thickness at the edges of the semiconductor wafer supported by the chuck with the 25% undercut recessed region was approximately 1.5% to 1.8% above the baseline deposition layer thickness, whereas the maximum normalized deposition layer thickness at the edges of the semiconductor wafer supported by the chuck without a recessed region was approximately 3.3% to 3.4% above the baseline deposition layer thickness. Thus, the use of the chuck with a 25% undercut recessed region resulted in a ~50% reduction in edge-region non-uniformity as compared to a chuck without a recessed region, similar to what was exhibited by FIG. 9.

Figure 11:
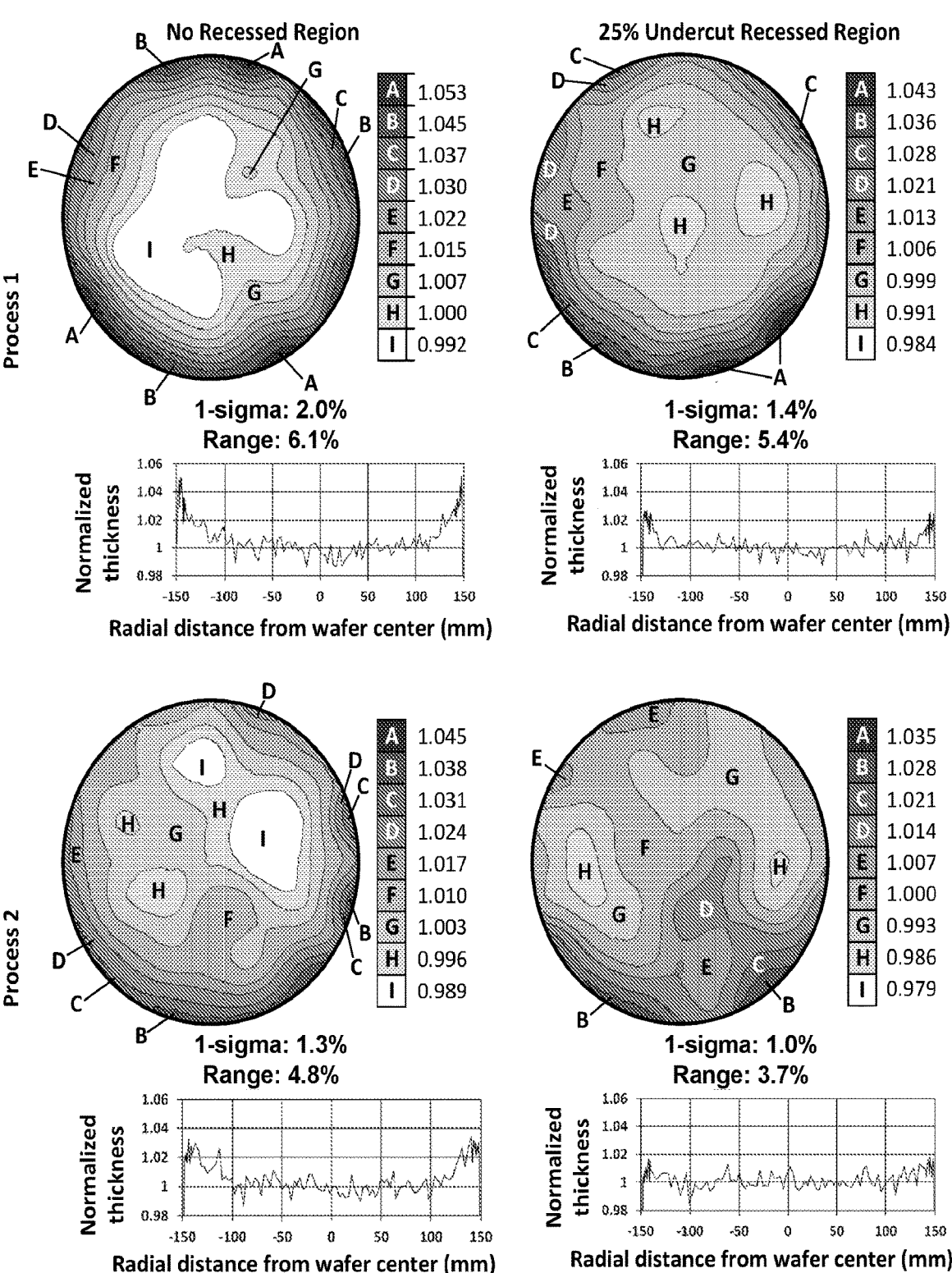
FIG. 11 depicts normalized deposition layer thickness heat maps for four example semiconductor wafers.

To provide further demonstration of how the use of a chuck with a recessed region may improve wafer uniformity, reference is made to FIG. 11, which depicts wafer deposition layer thickness measurement "heat maps" for the four wafers for which normalized deposition layer thicknesses are shown in FIGS. 9 and 10 (the normalized deposition layer thickness plot for each such semiconductor wafer is shown in isolation below each corresponding heat map). The heat maps in FIG. 11 indicate different values of normalized deposition layer thicknesses using different degrees of shading. The heat maps illustrate that the uniformity variation is much less pronounced for the semiconductor wafers supported on a chuck with a recessed region (e.g., a 25% undercut recessed region) during processing as compared with the semiconductor wafers supported on a chuck without a recessed region during processing. For example, the deposition layer thickness exhibited by the semiconductor wafer supported by the chuck without the recessed region during the first semiconductor process demonstrated a standard deviation of 2% and a range of 6.1%, as compared with a standard deviation of 1.4% and a range of 5.4% for the semiconductor wafer subjected to the same first semiconductor process while being supported by the chuck having the 25% undercut recessed region. Similarly, the deposition layer thickness exhibited by the semiconductor wafer supported by the chuck without the recessed region during the second semiconductor process demonstrated a standard deviation of 1.3% and a range of 4.8%, as compared with a standard deviation of 1.0% and a range of 3.7% for the semiconductor wafer subjected to the same second semiconductor process while being supported by the chuck having the 25% undercut recessed region.

It was generally observed that increasing the percentage undercut for the recessed region resulted in corresponding increases in wafer edge-center uniformity, such that a chuck with a 15% undercut recessed region had better edge-center uniformity compared to a chuck that had no recessed region at all, a chuck with a 25% undercut recessed region had better edge-center uniformity compared to the chuck with the 15% undercut recessed region, and a chuck with a 40% undercut recessed region had better edge-center uniformity compared to the chuck with the 25% undercut recessed region. This trend may continue, e.g., up to a 50% undercut recessed region, for example, although for sufficiently large undercut regions, there may be a degradation in vacuum clamping force/efficiency since the surface area of the vacuum seal region may not provide sufficient sealing surface area for vacuum clamping to the chuck to work properly.

In particular, it will be understood that the present disclosure not only relates to chucks usable to produce semiconductor wafers having deposition layers (or etched away layers) with improved edge-center layer thickness uniformity, but also relates to semiconductor wafers with deposition layers (or etched away layers) produced while the subject semiconductor wafer is supported on a chuck such as those described herein, e.g., a chuck with a recessed region as described earlier. Such semiconductor wafers may exhibit a maximum layer thickness near the edge of the semiconductor wafer that is within 3% or less of the average layer thickness within the center region of the semiconductor wafer, for example, within a center region that has a radius of two-thirds of the radius of the outer edge of the semiconductor wafer.

Moreover, it will be understood that the present disclosure encompasses not only the chucks with the recessed regions discussed herein, but also encompasses methods of manufacture for such chucks.

For example, referring back to FIG. 2, the chuck 102 may be made from a ceramic or metal material. The metal, for example, may be aluminum, steel, titanium, alloys thereof, or other metals. Potential ceramic materials that may be used may include, for example, silicon carbide or silicon nitride. It will be understood that any of a variety of fabrication techniques may be used to produce the chuck, including, for example, subtractive manufacturing techniques such as milling, turning, or other machining or additive manufacturing techniques, such as direct metal laser sintering or other three-dimensional printing technique. In some implementations, the chuck may be formed using a net-shape manufacturing process, such as casting, injection molding, or other technique and then optionally finish machined to achieve required dimensional tolerances.

Figure 12:
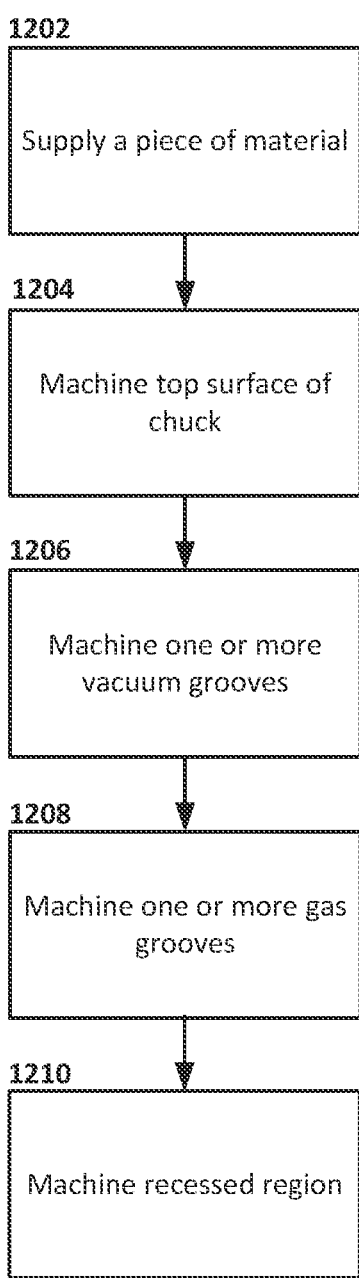
FIG. 12 depicts a flow chart for a method of manufacturing a chuck with a recessed region as discussed herein.

FIG. 12 shows an example of a machining process to fabricate a chuck with a recessed region. In 1202, a piece of material is supplied; the material may be a ceramic or a metal, such as aluminum. In 1204, a top surface may be machined. The top surface may have a flatness requirement and may be fabricated using one or more different machining processes, e.g., machining followed by lapping or polishing. In 1206, one or more vacuum grooves may be machined into the chuck. The one or more vacuum grooves may be connected to through-holes that, when the chuck is assembled to a pedestal, may fluidically connect to a vacuum source and may allow the one or more vacuum grooves to pull a vacuum on the back side of a semiconductor wafer that may be placed on the top surface of the chuck. Any suitable machining operation may be used to machine the one or more vacuum grooves, including milling, electron-discharge machining, turning (using a lathe), etc. In 1208, one or more gas grooves may be machined into the chuck. The one or more gas grooves may be connected to holes or ports that, when the chuck is installed in a semiconductor processing chamber, may connect to gas sources configured to flow inert gas into the chamber via the one or more gas grooves. As with the one or more vacuum grooves, the one or more gas grooves may be machined by any suitable machining process. In 1210, the recessed region may be machined into the chuck using any suitable machining technique. Any suitable machining operation may be used to machine the recessed region, including milling, electron-discharge machining, turning (using a lathe), etc. The operations of 1204, machining the top surface, 1206, machining the one or more vacuum grooves, 1208, machining the one or more gas grooves, and 1210, machining the recessed region, do not necessarily need to occur in any particular order and may be done in any order after the piece of material is supplied in block 1202.

In some implementations, there may be post-machining operations performed on the chuck, such as coating applications (such as applying an anodized coating on an aluminum chuck), firing operations (such as firing a machined green ceramic version of the chuck in a kiln or other furnace so as to sinter the machined ceramic into a hardened, sintered ceramic chuck), etc. In the case of additively manufactured chucks, the overall shape of the chuck may be formed layer-by-layer, with the one or more vacuum grooves, one or more gas grooves, and/or recessed region at times being formed as part of the creation of one or more layers. In some additively manufactured chucks, subtractive machining operations may be optionally performed after the additive manufacturing steps are complete, e.g., to provide more precisely machined features, top surfaces with a desired degree of flatness, etc.

It will be further understood that in some implementations, the chucks discussed herein may be part of a semiconductor processing system which may include a controller. Such systems can comprise semiconductor processing equipment, including a processing tool or tools, a chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Terms such as "about," "approximately," "substantially," "nominal," or the like, when used in reference to quantities or similar quantifiable properties, are to be understood to be inclusive of values within ±10% of the values or relationship specified (as well as inclusive of the actual values or relationship specified), unless otherwise indicated.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. An apparatus for semiconductor processing, the apparatus comprising:
   a pedestal having:
      a heating element; and
      a top plate; wherein:
         the top plate includes:
            a substrate support surface configured to support a semiconductor wafer when the semiconductor wafer is placed on the pedestal;
            one or more vacuum grooves located within a center region of the pedestal, each vacuum groove extending up to the substrate support surface and having an outer edge, wherein a center axis of the top plate passes through the center region;
            a gas groove that extends around the center region of the pedestal and has an inner edge and an outer edge; and
            a recessed region having one or more recessed surfaces and an inner perimeter positioned between the center region and the inner edge of the gas groove,
            wherein the one or more recessed surfaces, the one or more vacuum grooves, and the gas groove are all on the same side of the top plate, wherein the one or more recessed surfaces are each offset along the center axis from a reference plane coincident with the substrate support surface so that there is a gap between the one or more recessed surfaces and the reference plane that is less than 0.05 inches and such that the one or more recessed surfaces are closer to the reference plane than a bottom surface of the gas groove, and
            wherein, for each vacuum groove of the one or more vacuum grooves, a portion of the outer edge of the vacuum groove that is closest to the inner perimeter is separated from the inner perimeter by at least a corresponding first distance $D_1$ and separated from the closest portion of the gas groove by at least a corresponding second distance $D_2$.

2. The apparatus of claim 1, wherein, for each vacuum groove, $(D_2-D_1)/D_2=0.4\pm0.1$.

3. The apparatus of claim 1, wherein, for each vacuum groove, $(D_2-D_1)/D_2=0.25\pm0.05$.

4. The apparatus of claim 1, wherein, for each vacuum groove, $(D_2-D_1)/D_2=0.15\pm0.05$.

5. The apparatus of claim 1, wherein the inner edge of the gas groove at least partially bounds the recessed region.

6. The apparatus of claim 1, wherein there is a radial gap between the inner edge of the gas groove and an outer perimeter of the recessed region.

7. The apparatus of claim 1, wherein the gap between the one or more surfaces of the recessed region and the substrate support surface is greater than than or equal to 0.005 inches.

8. The apparatus of claim 1, wherein the inner edge of the gas groove is within a circular region having a diameter of 300 mm±1 mm and the outer edge of the gas groove is outside of the circular region.

9. The apparatus of claim 1, wherein the top plate is made of aluminum.

10. The apparatus of claim 1, wherein the top plate is made of a ceramic.

11. The apparatus of claim 1, further comprising:
   a process chamber;
   an inert gas source; and
   a vacuum source, wherein:
      the pedestal is located within the process chamber,
      the inert gas source is configured to controllably flow an inert gas to the gas groove, and
      the vacuum source is configured to controllably draw a vacuum on the one or more vacuum grooves.

12. The apparatus of claim 11, further comprising:
   a showerhead positioned above the pedestal and configured to distribute gases flowed therethrough towards the pedestal; and
   one or more process gas sources, wherein the one or more process gas sources are each configured to controllably flow a corresponding process gas through the showerhead.

13. The apparatus of claim 12, wherein the one or more process gas sources are configured to controllably flow a metal-containing gas that also includes an element selected from the group consisting of fluorine and chlorine.

14. A chuck for supporting a semiconductor wafer during semiconductor processing, the chuck comprising:
   a substrate support surface configured to support the semiconductor wafer when the semiconductor wafer is placed thereupon;
   one or more vacuum grooves located within a center region of the chuck, each vacuum groove extending up to the substrate support surface and having an outer edge, wherein a center axis of the chuck passes through the center region and is perpendicular to the substrate support surface;

a gas groove that extends around the center region and has an inner edge and an outer edge; and a recessed region having one or more recessed surfaces and an inner perimeter interposed between the center region and the inner edge of the gas groove, wherein the one or more recessed surfaces, the one or more vacuum grooves, and the gas groove are all on the same side of a top plate, wherein the one or more recessed surfaces are each offset along the center axis from a reference plane coincident with the substrate support surface so that there is a gap between the one or more recessed surfaces and the reference plane and such that the one or more recessed surfaces are closer to the reference plane than a bottom surface of the gas groove, and wherein the smallest circular region that encircles the one or more vacuum grooves is separated from the inner perimeter by a first distance $D_1$ and separated from the closest portion of the gas groove by a second distance $D_2$ and $D_2-D_1/D_2=0.3\pm0.2$.

15. An apparatus for semiconductor processing, the apparatus comprising:

a pedestal having:

a heating element; and a top plate; wherein:

the top plate includes:

a substrate support surface configured to support a semiconductor wafer when the semiconductor wafer is placed on the pedestal;

one or more vacuum grooves located within a center region of the pedestal, each vacuum groove extending up to the substrate support surface and having an outer edge, wherein a center axis of the top plate passes through the center region;

a gas groove that extends around the center region of the pedestal and has an inner edge and an outer edge; and a recessed region having one or more recessed surfaces and an inner perimeter positioned between the center region and the inner edge of the gas groove, wherein the one or more recessed surfaces, the one or more vacuum grooves, and the gas groove are all on the same side of the top plate, wherein the one or more recessed surfaces are each offset along the center axis from a reference plane coincident with the substrate support surface so that there is a gap between the one or more recessed surfaces and the reference plane and such that the one or more recessed surfaces are closer to the reference plane than a bottom surface of the gas groove, and wherein, for each vacuum groove of the one or more vacuum grooves, a portion of the outer edge of the vacuum groove that is closest to the inner perimeter is separated from the inner perimeter by at least a corresponding first distance $D_1$ and separated from the closest portion of the gas groove by at least a corresponding second distance $D_2$, wherein $(D_2-D_1)/D_2$ is greater than or equal to 0.1 and less than or equal to 0.5.

16. The apparatus of claim 15, wherein, for each vacuum groove, $(D_2-D_1)/D_2=0.4\pm0.1$.

17. The apparatus of claim 15, wherein, for each vacuum groove, $(D_2-D_1)/D_2=0.25\pm0.05$.

18. The apparatus of claim 15, wherein, for each vacuum groove, $(D_2-D_1)/D_2=0.15\pm0.05$.

19. The apparatus of claim 15, wherein the inner edge of the gas groove at least partially bounds the recessed region.

20. The apparatus of claim 15, wherein there is a radial gap between the inner edge of the gas groove and an outer perimeter of the recessed region.

21. The apparatus of claim 15, wherein the gap between the one or more recessed surfaces of the recessed region and the substrate support surface is less than or equal to 0.05 inches.

22. The apparatus of claim 15, wherein the inner edge of the gas groove is within a circular region having a diameter of 300 mm±1 mm and the outer edge of the gas groove is outside of the circular region.

23. The apparatus of claim 15, wherein the top plate is made of aluminum.

24. The apparatus of claim 15, wherein the top plate is made of a ceramic.

25. The apparatus of claim 15, further comprising:

a process chamber;

an inert gas source; and a vacuum source, wherein:

the pedestal is located within the process chamber, the inert gas source is configured to controllably flow an inert gas to the gas groove, and the vacuum source is configured to controllably draw a vacuum on the one or more vacuum grooves.

26. The apparatus of claim 25, further comprising:

a showerhead positioned above the pedestal and configured to distribute gases flowed therethrough towards the pedestal; and one or more process gas sources, wherein the one or more process gas sources are each configured to controllably flow a corresponding process gas through the showerhead.

27. The apparatus of claim 26, wherein the one or more process gas sources are configured to controllably flow a metal-containing gas that also includes an element selected from the group consisting of fluorine and chlorine.

* * * * *